United States Patent
Glover et al.

(10) Patent No.: US 7,826,215 B2
(45) Date of Patent: Nov. 2, 2010

(54) DUCTED AIR TEMPERATURE SENSOR

(75) Inventors: Troy Williams Glover, Raleigh, NC (US); Michael Sean June, Raleigh, NC (US); Vinod Kamath, Raleigh, NC (US); Whitcomb Randloph Scott, III, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 12/032,230

(22) Filed: Feb. 15, 2008

(65) Prior Publication Data

US 2009/0207565 A1 Aug. 20, 2009

(51) Int. Cl.
*H05K 7/20* (2006.01)
*F28F 7/00* (2006.01)
*H05K 5/00* (2006.01)
*G05D 23/00* (2006.01)

(52) U.S. Cl. ............................ 361/679.49; 361/679.51; 361/696; 361/697; 165/80.3; 454/184; 700/300

(58) Field of Classification Search ................ 361/690, 361/691, 694, 695, 696, 697, 679.48, 679.49, 361/679.51; 165/80.2–80.3; 454/184; 700/207, 700/299, 300

See application file for complete search history.

(56) References Cited

U.S. PATENT DOCUMENTS

| | | | |
|---|---|---|---|
| 6,253,834 B1 * | 7/2001 | Sterner | 165/80.3 |
| 6,487,463 B1 * | 11/2002 | Stepp, III | 700/79 |
| 2002/0126453 A1 | 9/2002 | Ubukata | |
| 2004/0202534 A1 | 10/2004 | Inoue et al. | |
| 2005/0264766 A1 * | 12/2005 | Morimoto et al. | 353/61 |
| 2006/0023420 A1 * | 2/2006 | Tucker et al. | 361/695 |
| 2006/0123436 A1 | 6/2006 | Tanaka et al. | |

FOREIGN PATENT DOCUMENTS

JP 07020966 1/1995

OTHER PUBLICATIONS

Nordeen Larson and Arthur M. Petersen Sea-Bird Electronics, Inc., Temperature Measurements in Flowing Water: Viscous Heating of Sensor Tips, From Proceeding of 1$^{st}$ IGHEM Meeting, Jun. 1996, 10 pages, Montreal Canada.

* cited by examiner

*Primary Examiner*—Zachary M Pape
(74) *Attorney, Agent, or Firm*—Cynthia G. Seal; Jeffrey L. Streets

(57) ABSTRACT

A temperature isolation duct in a computer system comprising a chassis securing a circuit board and a fan system that draws air through the chassis, and a heat-generating component is mounted on the circuit board and exposed to the air flow. The hot air duct passively directs air heated by the heat-generating component from a single hot air duct inlet in direct downstream alignment with the heat-generating component to a single hot air duct outlet. A thermal sensor is secured within, or in direct alignment with, the hot air duct near the duct outlet for sensing the temperature of air flowing through the hot air duct and generating a temperature signal. A controller is in electronic communication with the thermal sensor for receiving the temperature signal and in electronic communication with the fan system for sending a fan speed control signal.

17 Claims, 3 Drawing Sheets

DUCTED AIR TEMPERATURE SENSOR

BACKGROUND OF THE INVENTION

1. Field of the Invention

The present invention relates to a method and apparatus for sensing the temperature of a heat-generating component of a computer system.

2. Description of the Related Art

Computer systems include many electronic components generate waste heat as a by product of their normal functions. Since excessive heat can lead to component failure, significant efforts are made to design and operate computer systems to prevent components from reaching high temperatures. The most common approach to this problem is the use of forced air convection through computer chassis. For individual computers, sufficient cooling may be achieved using a single fan to circulate room temperature air through the enclosure. However, data centers generally require computer room air conditioning (CRAC) systems and fans that operate within individual chassis or racks.

Fans are necessary to make sure that air is circulated through each unit in an appropriate direction and at an appropriate flow rate. The direction of air flow is generally established during installation of the fan based on the direction of the motor and fan blades. The air flow rate is determined by the speed of the motor, the size of the fan blades, and the number of fans being used. However, the fans are also known to produce high volumes of noise and to consume a significant portion of the electricity used in a data center. Accordingly, it is not only important that the fans provide sufficient cooling, it is important that the fans are not run at excessive speeds.

Variable speed motors may be used in conjunction with a controller to adjust the fan speed as necessary. Typically, the temperature of an important heat-generating component, such as a processor, is measured with a thermocouple and communicated to a controller. The controller then monitors the processor temperature and adjusts the fan speed to achieve an air flow rate that prevents the processor from getting too hot. This type of temperature control requires mounting a thermocouple as close as possible to the heat-generating component. Unfortunately, this typically requires customization of the motherboard.

It would be desirable to have a system that could sense air temperature at one or more locations within a computer chassis independent of the position of the thermal sensors. It would also be desirable to have a system that reduced fluctuations in temperature measurements of the thermal sensors.

SUMMARY OF THE INVENTION

One embodiment of the invention provides a computer system, comprising a chassis securing a circuit board, a fan system mounted in the chassis, wherein the fan system draws air through the chassis and establishes an airflow direction, and a heat-generating component mounted on the circuit board and exposed to the air flow. A hot air duct passively directs air heated by the heat-generating component from a single hot air duct inlet in direct downstream alignment with the heat-generating component to a single hot air duct outlet downstream of the single hot air duct inlet, wherein the hot air duct has a length to width aspect ratio of greater than four. A first thermal sensor is secured within the hot air duct near the single hot air duct outlet for sensing the temperature of air flowing through the hot air duct and generating a first temperature signal. The system also includes a controller in electronic communication with the first thermal sensor for receiving the temperature signal from the first thermal sensor and in electronic communication with the fan system for sending a fan speed control signal to the fan system. Optionally, the hot air duct may extend through, over or around a second component on the circuit board to avoid thermal effects of the second component.

Another embodiment of the invention further comprises an ambient air duct passively directing ambient air from a single ambient air duct inlet in direct downstream alignment with a chassis air inlet to a single ambient air duct outlet downstream of the single inlet, wherein the ambient air duct has a length to width aspect ratio of greater than four. A second thermal sensor is secured within the ambient air duct near the single ambient air duct outlet for sensing the temperature of air flowing through the ambient air duct, wherein the controller is in electronic communication with the second thermal sensor for receiving the temperature signal from the second thermal sensor.

In yet another embodiment, a method controls the temperature of a heat-generating component on a circuit board within a computer chassis. The method comprises actively drawing cooling air through the chassis in an airflow direction from a first end to a second end and passively directing air heated by the heat-generating component into a hot air duct through a single inlet positioned in direct downstream alignment with the first heat-generating component. The heated air passes through the air duct to a single outlet positioned near a downstream edge of the circuit board, wherein the air duct has a length to width aspect ratio greater than four. The method further includes sensing the temperature of heated air passing through the hot air duct near the downstream edge of the circuit board, and adjusting the flow rate of the cooling air being actively drawn through the chassis to control the sensed temperature of the heated air.

Other embodiments, aspects, and advantages of the invention will be apparent from the following description and the appended claims.

DETAILED DESCRIPTION OF PREFERRED EMBODIMENTS

Figure 1:
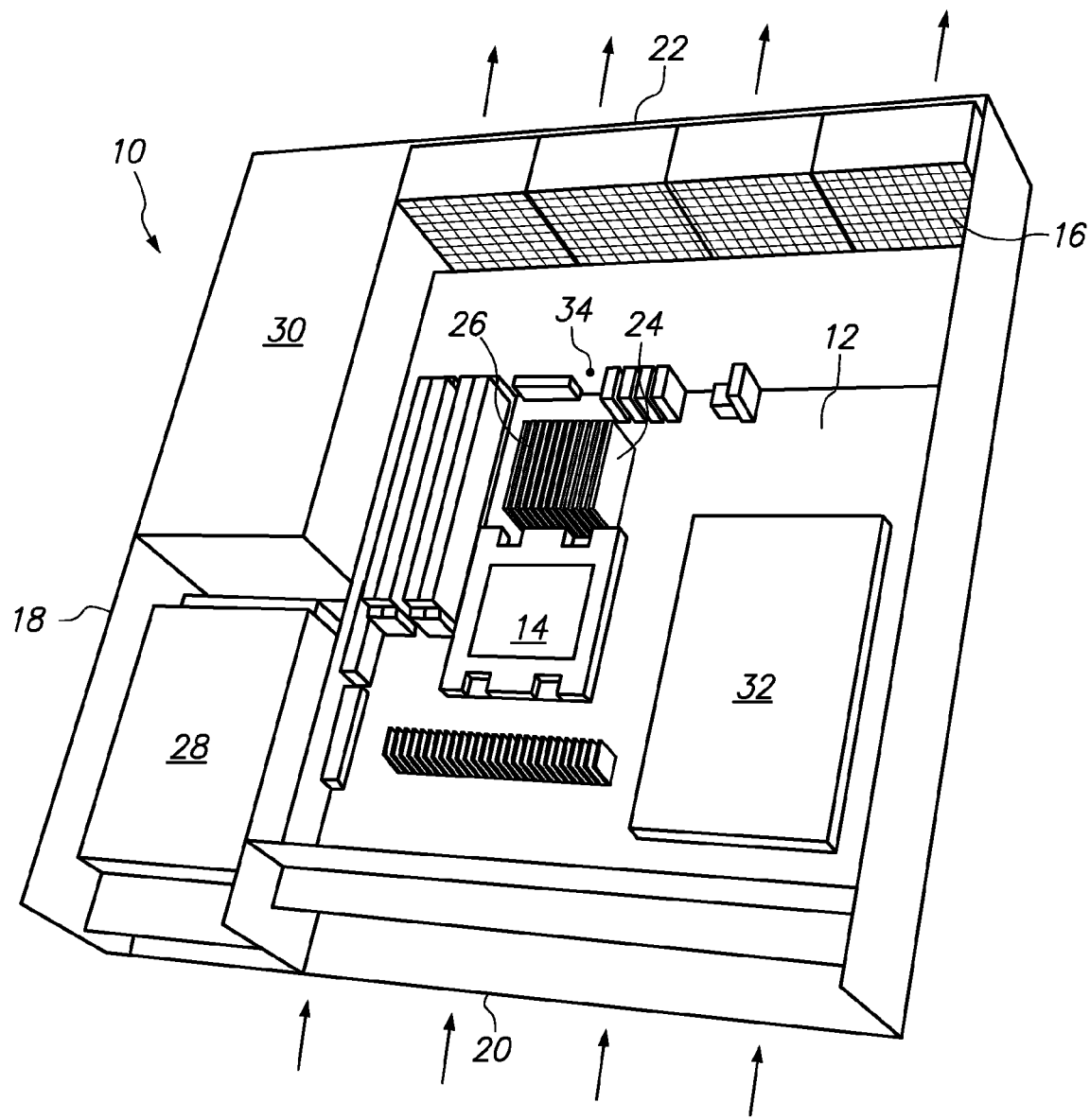
FIG. 1 is a perspective view of a computer system having a circuit board with a heat-generating component and a fan system drawing cooling air over the component.

One embodiment of the invention provides a computer system, comprising a chassis securing a circuit board, a fan system mounted in the chassis, wherein the fan system draws air through the chassis and establishes an airflow direction, and a heat-generating component mounted on the circuit board and exposed to the air flow. A hot air duct passively directs air heated by the heat-generating component from a single hot air duct inlet in direct downstream alignment with the heat-generating component to a single hot air duct outlet downstream of the single hot air duct inlet, wherein the hot air duct has a length to width aspect ratio of greater than four. A first thermal sensor is secured within the hot air duct near the single hot air duct outlet for sensing the temperature of air flowing through the hot air duct and generating a first temperature signal. The system also includes a controller in electronic communication with the first thermal sensor for receiving the temperature signal from the first thermal sensor and in electronic communication with the fan system for sending a fan speed control signal to the fan system.

In a further embodiment, the hot air duct has a substantially uniform cross-section along the length from the single inlet to the single outlet. A preferred air duct is made from a material having a low thermal conductivity, such as a polymeric material. Optionally, the hot air duct is installed to run generally parallel to the airflow direction. Embodiments having the single hot air duct outlet positioned adjacent a downstream edge of the circuit board allow the first thermal sensor to be secured to the chassis downstream of the circuit board. The hot air duct may be secured to the circuit board, but it may also be secured to the chassis. The hot air duct prevents mixing of heat air with ambient air, which mixing can increase fluctuations and offset of the temperature measured. Accordingly, the hot air duct may extend through, over or around a second component on the circuit board, such as a heat exchanger. For example, the heat-generating component may be a processor and the second component may be a heat exchanger mounted to a memory controller hub. Other non-limiting examples of a heat-generating component may be selected from a hard drive, memory device and a processor.

In another embodiment, the thermal sensor is secured to the chassis independent of the circuit board and the hot air duct passively directs a continuous sample of a desired air stream to the thermal sensor. Any of a plurality of circuit boards having different component layouts may be used within the chassis, wherein each circuit board layout has a unique hot air duct that passively directs air heated by the heat-generating component from the single hot air duct inlet into thermal communication with the first thermal sensor at a fixed position in the chassis. As a result, the thermal sensor may be positioned within the chassis without regard to which of the plurality of circuit boards will be installed.

In yet another embodiment, the system further comprises an ambient air duct passively directing ambient air from a single ambient air duct inlet in direct downstream alignment with a chassis air inlet to a single ambient air duct outlet downstream of the single inlet, wherein the ambient air duct has a length to width aspect ratio of greater than four. A second thermal sensor is secured within the ambient air duct near the single ambient air duct outlet for sensing the temperature of air flowing through the ambient air duct, wherein the controller is in electronic communication with the second thermal sensor for receiving the temperature signal from the second thermal sensor. Preferably, the single hot air duct outlet and the single ambient air duct outlet are adjacent a downstream edge of the circuit board. Accordingly, the first and second thermal sensors may be secured to the chassis downstream of the circuit board within or in alignment with the hot air duct and ambient air duct, respectively.

In a still further embodiment, a method controls the temperature of a heat-generating component on a circuit board within a computer chassis. The method comprises actively drawing cooling air through the chassis in an airflow direction from a first end to a second end and passively directing air heated by the heat-generating component into a hot air duct through a single inlet positioned in direct downstream alignment with the first heat-generating component. The heated air passes through the air duct to a single outlet positioned near a downstream edge of the circuit board, wherein the air duct has a length to width aspect ratio greater than four. The method further includes sensing the temperature of heated air passing through the hot air duct near the downstream edge of the circuit board, and adjusting the flow rate of the cooling air being actively drawn through the chassis to control the sensed temperature of the heated air. Optionally, the method may include extending a middle portion of the air duct through, over or around a second component on the circuit board to avoid interference in the measurement of air temperature.

FIG. 1 is a perspective view of a computer system 10 having a circuit board 12 with a heat-generating component 14 and a fan system 16 drawing cooling air over the component 14 and other components in the chassis 18 (top cover removed). The chassis typically is closed on the top, bottom and sides, and provides an air flow pathway between a front 20 and a back 22. The fan system 16 may include one or more fans, such as the assembly of fans shown, to draw ambient air through the front 20 and out the back 22. Accordingly, the fan system establishes an air flow direction from front to back. As the air cools the components, the air becomes heated.

However, neither the heating nor the air flow is entirely uniform across the circuit board. Some components, such as the processor 14, memory controller hub 24 (beneath heat exchanger 26), disk drive 28, power supply 30, and optional PCI adapter cards 32, produce localized heat. As air flows over or near these components, the air temperature increases and the heated air is carried in the air flow direction toward the back of the chassis. However, the components have different heights and are positioned throughout the chassis such that the air circulates and mixes somewhat as it flows through the chassis. Therefore, the temperature of the air at any particular point in the chassis may be a complex and fluctuating function of the overall air flow rate, component position, the component geometry, the installation of optional adapter cards, and the like.

As shown in FIG. 1, the processor 14 generates heat that is transferred into the air flowing over the processor from the front 20. The heated air passing the processor 14 then encounters the heat exchanger 26, which operates to dissipate heat from the underlying memory controller hub 24. Accordingly, the heat exchanger further increases the temperature of the air and may alter the flow of air. Therefore, the temperature of the air at a thermal sensor or thermister 34 positioned on the chassis downstream of the heat exchanger 26 is not representative of the processor 14 temperature or even the temperature of the air as a result of heat removed from the processor 14. Rather, the temperature at the downstream thermister 34 is partially affected by the temperature of the processor 14, the temperature of the heat exchanger 26, and the extent to which the air has mixed with ambient or cooler air within the chassis 18. It should be recognized that a heat exchanger may optionally be positioned in thermal contact with the processor 14 or other heat-generating components, but a heat exchanger is not required and has not been shown to better illustrate the hot air duct.

Figure 2:
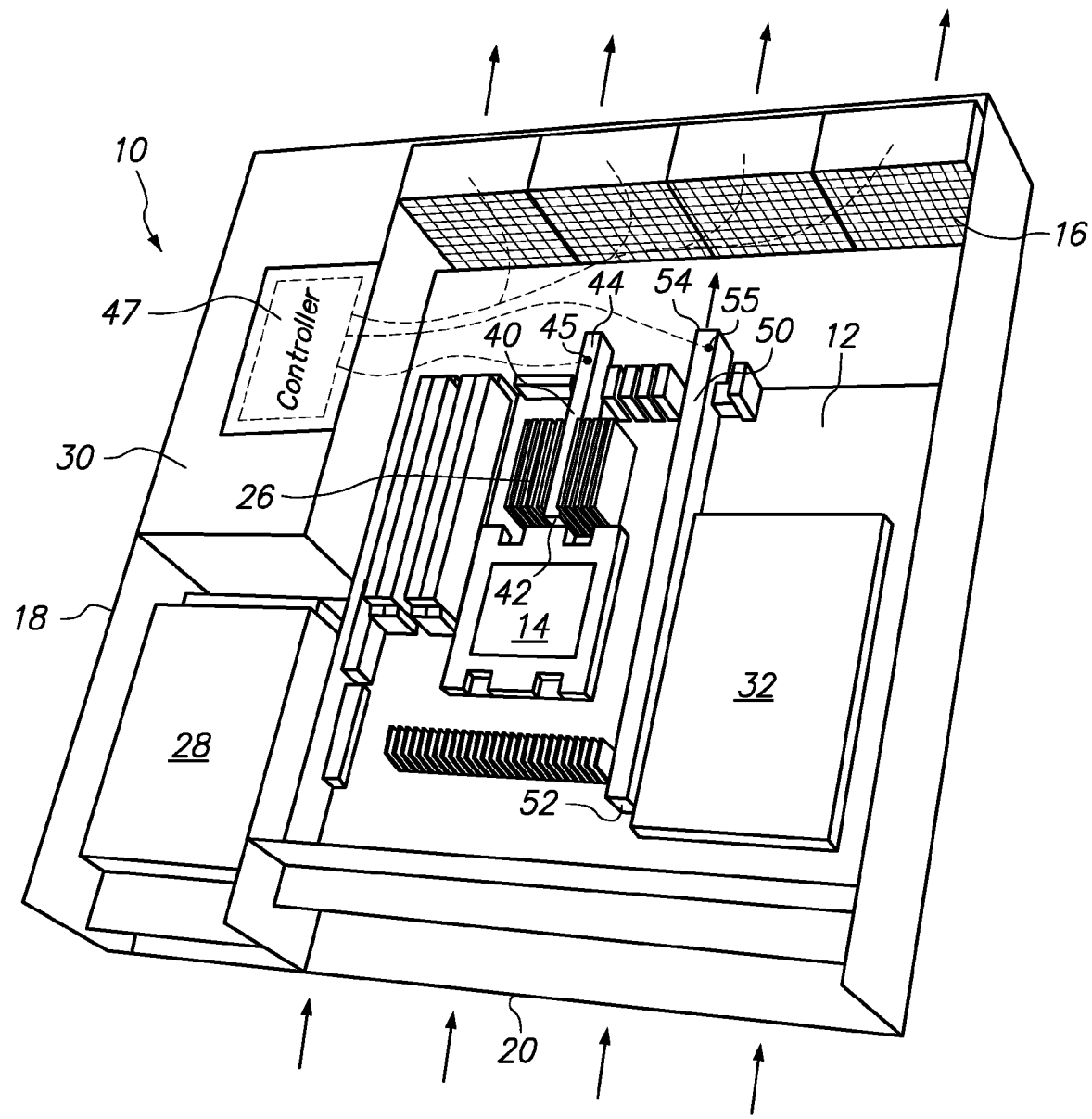
FIG. 2 is a perspective view of the computer system including an air temperature isolation duct.

FIG. 2 is a perspective view of the computer system 10 including an air temperature isolation duct, implemented here as a hot air duct 40. The hot air duct 40 has a generally uniform cross-sectional shape in the form of a rectangular conduit that extends from an inlet end 42 in downstream alignment with the processor 14 to an outlet end 44 along the downstream edge of the circuit board 12. As shown, the hot air duct 40 extends through the heat exchanger 26 so that the air within the hot air duct 40 is prevented from mixing with air that is further heated by the heat exchanger 26. Furthermore, the hot air duct 40 directs the air heated by the processor 14 to a thermal sensor 45 that may be disposed within, or in direct alignment with, the hot air duct 40. If the processor 14 has a heat exchanger mounted thereon, the hot air duct 40 may have its single inlet 42 disposed to receive substantially only air that is flowing between the heat sink fins. Accordingly, the hot air duct will preferably not extend above the processor heat sink Optionally, the hot air duct 40 may be secured to the MCH heat exchanger 26, although the duct preferably has a low thermal conductivity to minimize any heat transfer between the heat exchanger 26 and the air within the duct 40. Alternatively, the duct 40 may be secured directly to the circuit board, such as using push tabs.

The first thermal sensor 45 is in electronic communication with a controller 47 and sends an electronic temperature signal to the controller. The controller 47 may utilize the temperature signal in a control algorithm to adjust the speed of the fans 16 so that the temperature sensed by the first thermal sensor 45 is controlled. For example, the temperature may be controlled at a setpoint temperature or between minimum and maximum temperatures. Those having ordinary skill in the art will have knowledge of various control algorithms that may be implemented in accordance with the invention. However, embodiments of the present invention are not limited to any particular control scheme or algorithm. Furthermore, the controller may be secured and operated on the circuit board or as part of the power supply or other component of the chassis.

The embodiment of system 10 shown in FIG. 2 includes an optional second temperature isolation duct, implemented as an ambient air duct 50 secured to the circuit board. The ambient air duct 50 has an inlet end 52 positioned upstream of heat-generating components and an outlet end 54 near the downstream edge of the circuit board 12. Accordingly, the ambient air duct 50 draws in air that is at ambient temperature and transfers the air through the duct to a second thermal sensor 55 within, or in direct alignment with, the ambient air duct 50. The ambient air duct provides the second thermal sensor 55 with ambient air that has not mixed with heated air with the chassis. As a result, the temperature measured by the second thermal sensor is representative of the temperature of ambient air that is being used to cool the system. The second thermal sensor 55 is also in communication with the controller 47, such that the controller may utilize the ambient temperature signal in the control algorithm or system diagnostics. For example, the ambient temperature provides the ability to determine whether temperature changes (such as at point 44) are attributable solely to a rising processor temperature or to a rise in the ambient air temperature entering through the front 20 of the chassis 18.

It should be recognized that the system may include any number of hot air ducts, ambient air ducts, or combinations thereof. However, it is important to understand that the temperature isolation ducts are not used for the purpose of directing cooling air to a hot component. Furthermore, the air passing through the temperature isolation ducts is intentionally designed and positioned to isolate that air from further temperature changes until the temperature has been measured by a downstream thermal sensor. Accordingly, the temperature isolation ducts preferably has a small cross-section, such as ½ inch by ½ inch, so that there is no significant loss, bypassing or isolation of cooling air. Although it is not important that air flow through the temperature isolation ducts at the same exact velocity as the air in the chassis generally, the ducts should not be so small in cross-section that the air experiences significant resistance to flow.

An aspect ratio is the magnitude of length in relation to the magnitude of width. For example, a square duct having a uniform cross-section along its entire length may be 4 inches long and have ½ inch width in two dimensions. Therefore, the aspect ratio of the duct is 8 (4 inches/½ inch).

Figure 3:
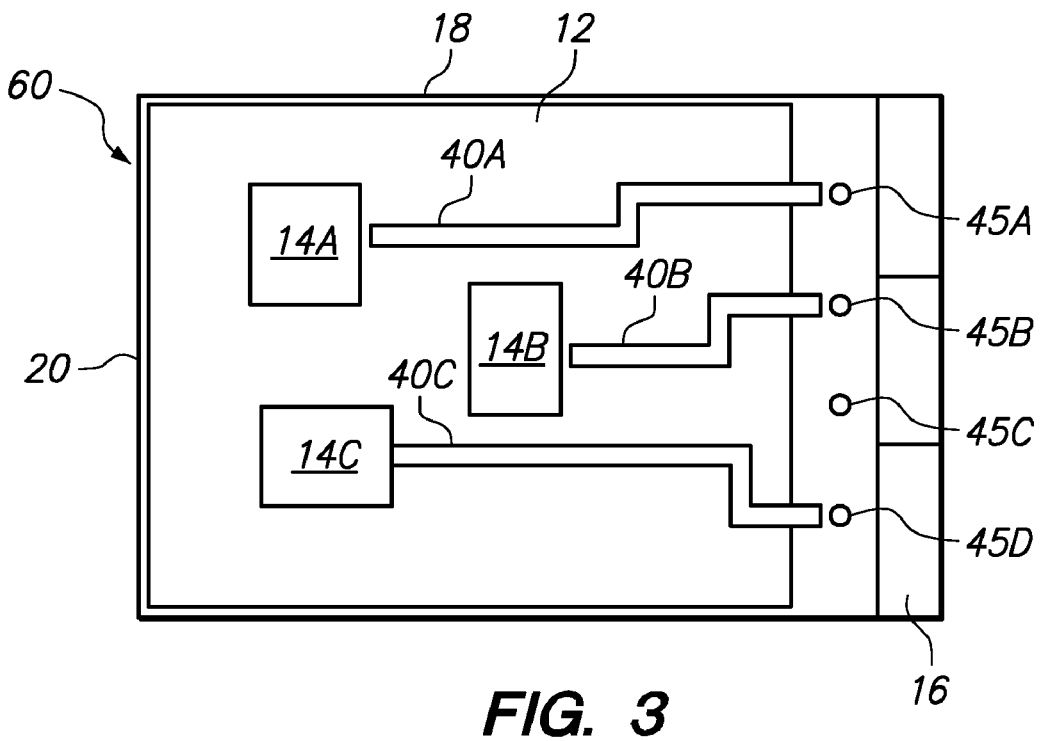
FIG. 3 is a schematic top view of a computer system including three air temperature isolation ducts and an array of thermal sensors.

FIG. 3 is a schematic top view of a computer system 60 including three air temperature isolation ducts 40A, 40B, 40C and an array of thermal sensors 45A, 45B, 45C, 45D. Each of the temperature isolation ducts 40A, 40B, 40C has an inlet end in downstream alignment with a heat-generating component 14A, 14B, 14C, respectively. The outlet end of each temperature isolation duct is in alignment with a thermister that is part of an array of sensors 45A, 45B, 45C, 45D. Each of the sensors is in electronic communication with a controller (not shown) and a first thermister 45A is associated with a first component 14A, a second thermister 45B is associated with a second component 14B, and a third thermister 45C is associated with a third component 14C. The controller may use the temperature signals from each thermister in determining how to operate the fans 16.

Figure 4A:
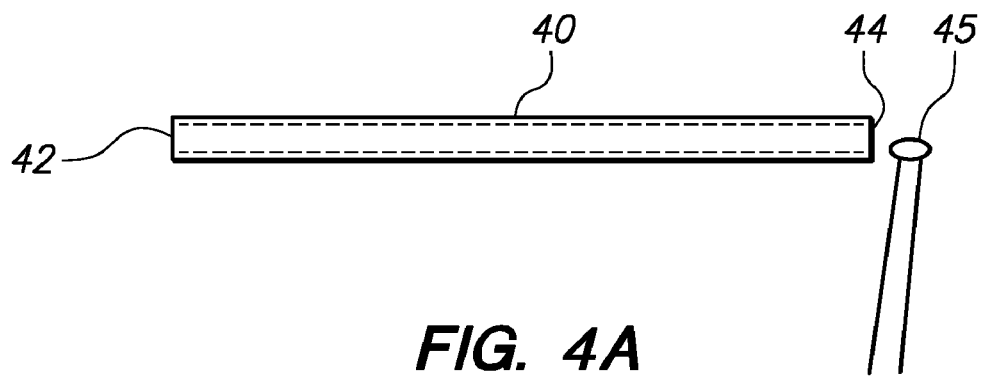
FIGS. 4A and 4B are schematic side views of a thermister in communication with an air duct.
Figure 4B:
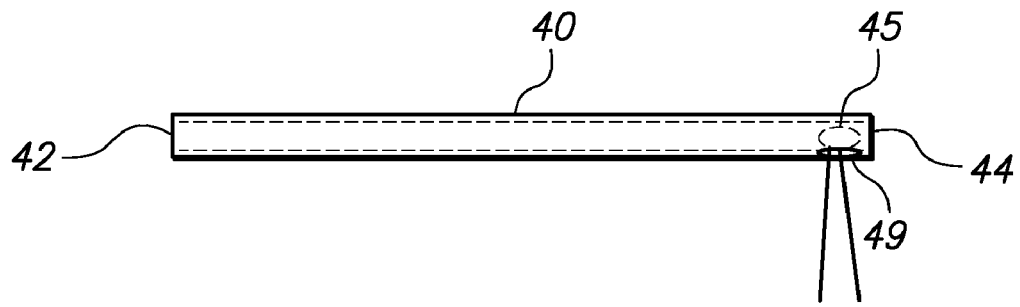

FIGS. 4A and 4B are schematic side views of a thermister 45 in communication with an air duct 40. In FIG. 4A, the thermister 45 is in axial alignment with the air duct 40 such that the air flows directly against and around the body of the thermister. In FIG. 4B, the air duct 40 has a hole 49 in the bottom near the outlet end 44 that allows the thermister 45 to extend into the duct. Accordingly, air within the duct flows around the thermister 45 and the duct tends to prevent the thermister from being exposed to mixed air temperatures.

EXAMPLE

Comparison of Thermal Sensor Measurements

Two circuit boards were prepared with identical components, layouts and dimensions, then placed into a common chassis having a fan pack that caused an equal amount of air from the same ambient air source to flow across the circuit boards. The first circuit board was laid out as shown in FIG. 1 and the second circuit board was laid out as shown in FIG. 2. The two circuit boards were mounted in separate modules in the common chassis according to FIG. 2, with the second circuit board positioned in the top bay. The two circuit boards were then operated with identical processor loads. For each of the two circuit boards, the temperature of the processor 14 and the temperature at a point directly downstream of the processor 14 at the edge of the circuit board 12 (point 34 in FIG. 1 and point 44 in FIG. 2) was measured. The steady state temperature differential between the processor 14 and point 34 in FIG. 1 was 14 degrees Celsius with wide fluctuations of 5 to 10 degrees Celsius. By contrast, the steady state temperature differential between the processor 14 and point 44 in FIG. 2 was 11 degrees Celsius with much less fluctuation.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
a chassis securing a circuit board;
a fan system mounted in the chassis, wherein the fan system draws air through the chassis and establishes an airflow direction;
a heat-generating component mounted on the circuit board and exposed to the air flow;
a hot air duct passively directing air heated by the heat-generating component from a single hot air duct inlet in direct downstream alignment with the heat-generating component to a single hot air duct outlet downstream of the single hot air duct inlet, wherein the hot air duct has a length to width aspect ratio of greater than four;
a first thermal sensor secured within the hot air duct near the single hot air duct outlet for sensing the temperature of the heated air flowing through the hot air duct and generating a first temperature signal; and
a controller in electronic communication with the first thermal sensor for receiving the temperature signal from the first thermal sensor and in electronic communication with the fan system for sending a fan speed control signal to the fan system.

2. The system of claim 1, wherein the hot air duct has a substantially uniform cross-section along the length from the single inlet to the single outlet.

3. The system of claim 1, wherein the hot air duct is generally parallel to the airflow direction.

4. The system of claim 1, wherein the single hot air duct outlet is adjacent a downstream edge of the circuit board.

5. The system of claim 4, wherein the first thermal sensor is secured to the chassis downstream of the circuit board.

6. The system of claim 1, wherein the fan speed is adjusted to control the temperature sensed by the first thermal sensor.

7. The system of claim 1, wherein the hot air duct is secured to the circuit board.

8. The system of claim 1, wherein the chassis selectively secures the circuit board, wherein the circuit board is selected from a plurality of circuit boards having different component layouts, and wherein each circuit board layout has a unique hot air duct that passively directs the air heated by the heat-generating component from the single hot air duct inlet into thermal communication with the first thermal sensor at a fixed position in the chassis.

9. The system of claim 1, characterized in that the temperature sensed by the first thermal sensor experiences less temperature fluctuation than in the absence of the hot air duct.

10. The system of claim 1, wherein the heat-generating component is selected from a hard drive, memory device and a processor.

11. The system of claim 1, wherein the hot air duct extends through a second component on the circuit board.

12. The system of claim 11, wherein the second component is a heat exchanger.

13. The system of claim 1, wherein the hot air duct extends over a second component on the circuit board.

14. The system of claim 1, wherein the hot air duct extends around a second component on the circuit board.

15. A computer system, comprising:
a chassis securing a circuit board;
a fan system mounted in the chassis, wherein the fan system draws air through the chassis and establishes an airflow direction;
a heat-generating component mounted on the circuit board and exposed to the air flow;
a hot air duct passively directing air heated by the heat-generating component from a single hot air duct inlet in direct downstream alignment with the heat-generating component to a single hot air duct outlet downstream of the single hot air duct inlet, wherein the hot air duct has a length to width aspect ratio of greater than four;
an ambient air duct passively directing ambient air from a single ambient air duct inlet in direct downstream alignment with a chassis air inlet to a single ambient air duct outlet downstream of the single inlet, wherein the ambient air duct has a length to width aspect ratio of greater than four;
a first thermal sensor secured within the hot air duct near the single hot air duct outlet for sensing the temperature of the heated air flowing through the hot air duct;
a second thermal sensor secured within the ambient air duct near the single ambient air duct outlet for sensing the temperature of the ambient air flowing through the ambient air duct; and
a controller in electronic communication with the first thermal sensor for receiving a first temperature signal from the first thermal sensor, in electronic communication with the second thermal sensor for receiving a second temperature signal from the second thermal sensor, and in electronic communication with the fan system for sending a fan speed control signal to the fan system.

16. The system of claim 15, wherein the single hot air duct outlet and the single ambient air duct outlet are adjacent a downstream edge of the circuit board.

17. The system of claim 16, wherein the first and second thermal sensors are secured to the chassis downstream of the circuit board.

* * * * *

UNITED STATES PATENT AND TRADEMARK OFFICE
CERTIFICATE OF CORRECTION

PATENT NO. : 7,826,215 B2
APPLICATION NO. : 12/032230
DATED : November 2, 2010
INVENTOR(S) : Troy Williams Glover et al.

It is certified that error appears in the above-identified patent and that said Letters Patent is hereby corrected as shown below:

On the Title page, after Item (75) naming the Inventors, the name "Whitcomb Randloph Scott, III" should read --Whitcomb Randolph Scott, III--.

Signed and Sealed this
Twelfth Day of March, 2013

Teresa Stanek Rea
*Acting Director of the United States Patent and Trademark Office*